United States Patent
Hwang et al.

(10) Patent No.: US 9,304,167 B2
(45) Date of Patent: Apr. 5, 2016

(54) APPARATUS OF THREE-DIMENSIONAL INTEGRATED-CIRCUIT CHIP USING FAULT-TOLERANT TEST THROUGH-SILICON-VIA

(71) Applicant: National Tsing Hua University, Hsinchu (TW)

(72) Inventors: Ting-Ting Hwang, Hsinchu (TW); Fu-Wei Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 251 days.

(21) Appl. No.: 14/210,718

(22) Filed: Mar. 14, 2014

(65) Prior Publication Data

US 2015/0185274 A1  Jul. 2, 2015

(30) Foreign Application Priority Data

Dec. 26, 2013  (TW) .............................. 102148566 A

(51) Int. Cl.
H03K 19/00 (2006.01)
G01R 31/3185 (2006.01)

(52) U.S. Cl.
CPC .............................. G01R 31/318513 (2013.01)

(58) Field of Classification Search
CPC ............... G01R 31/318513; G01R 31/318516; G01R 31/318541
USPC .......................................... 326/16, 37–41, 47
See application file for complete search history.

(56) References Cited

U.S. PATENT DOCUMENTS

| | | | | |
|---|---|---|---|---|
| 8,063,654 B2* | 11/2011 | Rahman | ......... | G01R 31/318544 324/762.03 |
| 8,593,170 B2* | 11/2013 | Van der Plas | .. | G01R 31/318513 324/762.03 |
| 8,890,607 B2* | 11/2014 | Huang | .................. | H01L 23/50 257/776 |
| 2010/0060310 A1* | 3/2010 | Laisne | ................ | H01L 25/0657 326/10 |
| 2010/0295600 A1* | 11/2010 | Kim | .................... | H01L 25/0657 327/365 |
| 2010/0332177 A1* | 12/2010 | Wu | ................ | G01R 31/318558 702/117 |
| 2011/0309519 A1* | 12/2011 | Kim | .................... | H01L 25/0657 257/774 |
| 2012/0319717 A1* | 12/2012 | Chi | ................ | G01R 31/318513 324/756.05 |
| 2013/0024737 A1* | 1/2013 | Marinissen | .... | G01R 31/318508 714/727 |
| 2013/0049796 A1* | 2/2013 | Pang | .............. | G01R 31/318558 326/16 |
| 2013/0093454 A1* | 4/2013 | Lai | ................. | G01R 31/318513 324/762.01 |

\* cited by examiner

*Primary Examiner* — Jason M Crawford
(74) *Attorney, Agent, or Firm* — Jackson IPG PLLC; Demian K. Jackson

(57) ABSTRACT

An apparatus of three-dimensional integrated-circuit (3D-IC) chip is provided. The apparatus uses a test through-silicon-via (TSV). The test TSV is used as a redundant TSV operated under a normal mode. Vice versa, the test TSV is remained to be used as a traditional test TSV under a scan mode. The present invention significantly reduces the number of redundant TSVs and the production cost of the chip.

8 Claims, 6 Drawing Sheets

| circuit name | #TSV | 2-tiers areasars (μm²) | | | #TSV | 4-tiers areasars (μm²) | | | | | |
|---|---|---|---|---|---|---|---|---|---|---|---|
| | | $W_{32}$ | $W_{48}$ | $W_{64}$ | | $W_{32}$ | $W_{48}$ | $W_{64}$ | $W_{32}$ | $W_{48}$ | $W_{64}$ |
| s1023 | 1698 | 544644 | 550564 | 570694 | 2413 | 199809 | 196753 | 203480 | 190794 | 192807 | 201421 |
| p22810 | 1618 | 293764 | 306916 | 321489 | 2287 | 102684 | 100561 | 114244 | 98847 | 100041 | 106929 |
| p34392 | 912 | 425104 | 444889 | 463362 | 1283 | 156025 | 158404 | 166744 | 148579 | 153978 | 163539 |
| p93791 | 2724 | 574561 | 589824 | 593812 | 3898 | 218089 | 212521 | 219024 | 201421 | 203481 | 209581 |
| s15280 | 3028 | 329034 | 328344 | 349559 | 4307 | 116052 | 1218988 | 1241841 | 1143189 | 195086 | 1217492 |
| ratio | | 1.04 | 1.03 | 1.00 | | 1.05 | 1.04 | 1.04 | 1.00 | 1.00 | 1.00 |

FIG.5

| circuit name | #blocks | #nets | 2-tiers WL_square (μm) | | | 2-tiers WL_ours (μm) | | | 4-tiers WL_square (μm) | | | 4-tiers WL_ours (μm) | | |
|---|---|---|---|---|---|---|---|---|---|---|---|---|---|---|
| | | | W32 | W48 | W64 | W32 | W48 | W64 | W32 | W48 | W64 | W32 | W48 | W64 |
| g1023 | 15 | 1603 | 25047 | 37458 | 51945 | 17456 | 25414 | 36542 | 21784 | 32745 | 42515 | 14784 | 22154 | 33258 |
| p22810 | 29 | 1518 | 42178 | 63215 | 84751 | 36541 | 52145 | 71548 | 34584 | 51468 | 68587 | 27545 | 43548 | 60237 |
| p34392 | 20 | 852 | 38451 | 58421 | 76541 | 27458 | 40218 | 62145 | 31530 | 48957 | 62985 | 24521 | 42158 | 55217 |
| p93791 | 33 | 2577 | 53125 | 78542 | 105476 | 42154 | 63258 | 80641 | 43563 | 60215 | 85258 | 38547 | 50487 | 77458 |
| f51505 | 32 | 2865 | 49851 | 72454 | 98744 | 43315 | 59314 | 93147 | 40878 | 62147 | 93841 | 31548 | 53147 | 73236 |
| ratio | | | | | | 0.76 | 0.78 | 0.82 | | | | 0.78 | 0.82 | 0.86 |

FIG.6

APPARATUS OF THREE-DIMENSIONAL INTEGRATED-CIRCUIT CHIP USING FAULT-TOLERANT TEST THROUGH-SILICON-VIA

TECHNICAL FIELD OF THE INVENTION

The present invention relates to a three-dimensional integrated-circuit (3D-IC) chip; more particularly, relates to using a test through-silicon-via (TSV) as a redundant TSV for repairing signals with fault tolerance, where the number of redundant TSVs is reduced; the chip area is not increased; and the production cost is reduced.

DESCRIPTION OF THE RELATED ARTS

With upgraded process technologies and chip functions, a 3D-IC chip, which is connected with stacked chips (stacked ICs) through TSVs, provides shorter wiring with a higher transistor unit density. The 3D-IC chip also provides heterogeneous integration for system-on-chips with more flexibility and choice.

TSV provides signal transmission between the stacked chips, which is also an important design issue. Since failed TSVs may happen during production and stacking on using the TSV technologies, the failed TSVs cannot normally transfer signals and the yield of the 3D-IC chips is declined with production cost increased.

In order to enhance the yield of the 3D-IC chips, the patent of US 20120190133 proposed by Michel J. Abou-Khalil et al. presented a concept for testing and repairing TSV. In addition, Lung et al. proposed a prior art (Chiao-Ling Lung, Yu-Shih Su, Shih-Hsiu Huang, Yiyu Shi and Shih-Chieh Chang, "Fault-tolerant 3D clock network," Design Automation Conference (DAC), 2011 48th, pp. 645-651, 2011), where a clock tree of the 3D-IC chip is used and the failed TSV is repaired by replacing the wiring of the clock tree with the wiring of pre-bond testing in each chip layer. But these conventional techniques do not propose the use of redundant TSVs for repairing. Although the documents proposed by Hsieh, Ye, Wu, Kang, Loi, Miyakawa et al. during 2007 to 2012 (Ang-Chih Hsieh, TingTing Hwang, "TSV Redundancy: Architecture and Design Issues in 3-D IC," Very Large Scale Integration (VLSI) Systems, IEEE Transactions on, vol. 20, no. 4, pp. 711-722, April 2012; ngming Ye and Krishnendu Chakrabarty, "TSV Open Defects in 3D Integrated Circuits: Characterization, Test, and Optimal Spare Allocation, "Design Automation Conference, pp. 1024-1030, 2012; Cheng-Wen Wu, Shyue-Kun Lu and Jin-Fu Li," On Test and Repair of 3D Random Access Memory, "Design Automation Conference, 2012 17th Asia and South Pacific (ASP-DAC), pp. 744-749, 2012; U. Kang, H. -J. Chung, S. Heo, S. -H. Ahn, H. Lee, S. -H. Cha, J. Ahn, D. Kwon, J H Kim, J. -W. Lee, H. -S. Joo, W. -S. Kim, H. -K. Kim, E. -M. Lee, S. -R. Kim, K. -H. Ma, D. -H. Jang, N. -S. Kim, M. -S. Choi, S. -J. Oh, J. -B. Lee, T. -K. Jung, J. -H. Yoo and C. Kim, "8 Gb 3D DDR3 DRAM through-silicon-via technology using", ISSCC Dig. Tech. Papers, pp. 130-131, 2009; I. Loi, S. Mitra, T H Lee, S. Fujita and L. Benini, "A low-overhead fault tolerance scheme for TSV-based 3D network on chip links", Proc. ICCAD, 2008; and N. Miyakawa, T. Maebashi, N. Nakamura, S. Nakayama, E. Hashimoto and S. Toyoda New Multi-Layer Stacking Technology and Trial Manufacture 2007, Honda Research Institute Japan Co. Ltd) and the patents of some prior arts (US 2010029560; U.S. Pat. No. 8,339,879 B2; and US 20120194228) mentioned about redundant TSV technologies, their redundant TSV structures added extra signal-repairing devices for enhancing the production yield of TSVs. Therein, Heish, Kang, Loi, Miyakawa et al. proposed the use of additional TSVs to replace failed TSVs for repairing abnormal signals. They added extra TSVs with circuit control to replace the signals of the failed TSVs with the signals of the extra TSVs, where the structure can be a twins structure, a switch box, a network-on-chip (NoC), etc. However, since the TSVs occupy a larger area as compared to the logic gate, the chip requires additional area to place additional TSVs. As a result, although the yield is enhanced, the number of TSVs and their area occupied are both increased with higher product cost.

In addition, Or-Bach, Zvi, et al., who proposed the patents of U.S. Pat. No. 8,405,420 and U.S. Pat. No. 8,362,800 B2 in 2013, revealed an architecture of field repair to replace failed TSV. Yet, this method does not reveal any concept of redundant TSV. Hsin-Chi Lai et al., who proposed the patent of US 20130093454 in 2013, revealed a way to test and repair failed TSVs. Yet, it does not disclose the use of a test TSV as a redundant TSV for repair signal.

Furthermore, related patents of TW201248777 and US20120248438 disclose a "fault-tolerant unit and method for through-silicon via." When through-silicon vias $TSV1 \sim TSVn$ are valid under a normal mode, a switch module is not connected with test path and nodes $N21 \sim N2n$. When a through-silicon vias $TSVi$ are not valid under a normal mode, the switch module connects node $N2i$ with at least one of another second nodes. Under a test mode, the switch module connects the test path with the nodes $N21$-$N2n$. This prior art uses a fault-tolerant unit to repair signal of the failed TSV by the test path without adding extra TSVs, where a switch module is used to toggle between a TSV testing mode and a normal mode. However, this prior art only repairs CLK signal by using the redundant wire of clock tree of a 2-dimensional chip. Hence, the prior arts do not fulfill all users' requests on actual use.

SUMMARY OF THE INVENTION

The main purpose of the present invention is to use a test TSV as a redundant TSV for repairing signal, where the number of redundant TSVs is reduced; the chip area is not increased; the production cost is lowered; and the chip becomes fault-tolerant.

To achieve the above purpose, the present invention is an apparatus of 3D-IC chip using a fault-tolerant test TSV, comprising a 3D-IC chip, a TSV part, two normal logic function circuits and two 3D-IC test logic circuits, where the 3D-IC chip comprises a first sub-chip and a second sub-chip set on the first sub-chip; the TSV part set between the first sub-chip and the second sub-chip comprises a plurality of TSVs and a test TSV; each of the TSVs has a first multiplexer at an input terminal and a second multiplexer at an output terminal; the test TSV has a third multiplexer at an input terminal and a demultiplexer at an output terminal; the TSV part transfers signals between the first sub-chip and the second sub-chip; the test TSV is used as a redundant TSV to repair signal of one of the TSVs when the TSV fails; the normal logic function circuits set in the first and second sub-chips are connected with the TSVs, the first multiplexers and the second multiplexers; the normal logic function circuits transmit signals through the TSVs; the 3D-IC test logic circuits set in the first and second sub-chips are connected with the test TSV, the third multiplexer and the demultiplexer; and the 3D-IC test logic circuits transfer test data between the first sub-chip and the second sub-chip through the test TSV and output test result. Accordingly, a novel apparatus of 3D-IC chip using a fault-tolerant test TSV is obtained.

BRIEF DESCRIPTION OF THE DRAWINGS

The present invention will be better understood from the following detailed descriptions of the preferred embodiments according to the present invention, taken in conjunction with the accompanying drawings, in which

FIG. 5 is the view showing the area size for the test TSV used as a redundant TSV; and FIG. 6 is the view showing the wire length for the test TSV used as a redundant TSV.

DESCRIPTION OF THE PREFERRED EMBODIMENT

Figure 1:
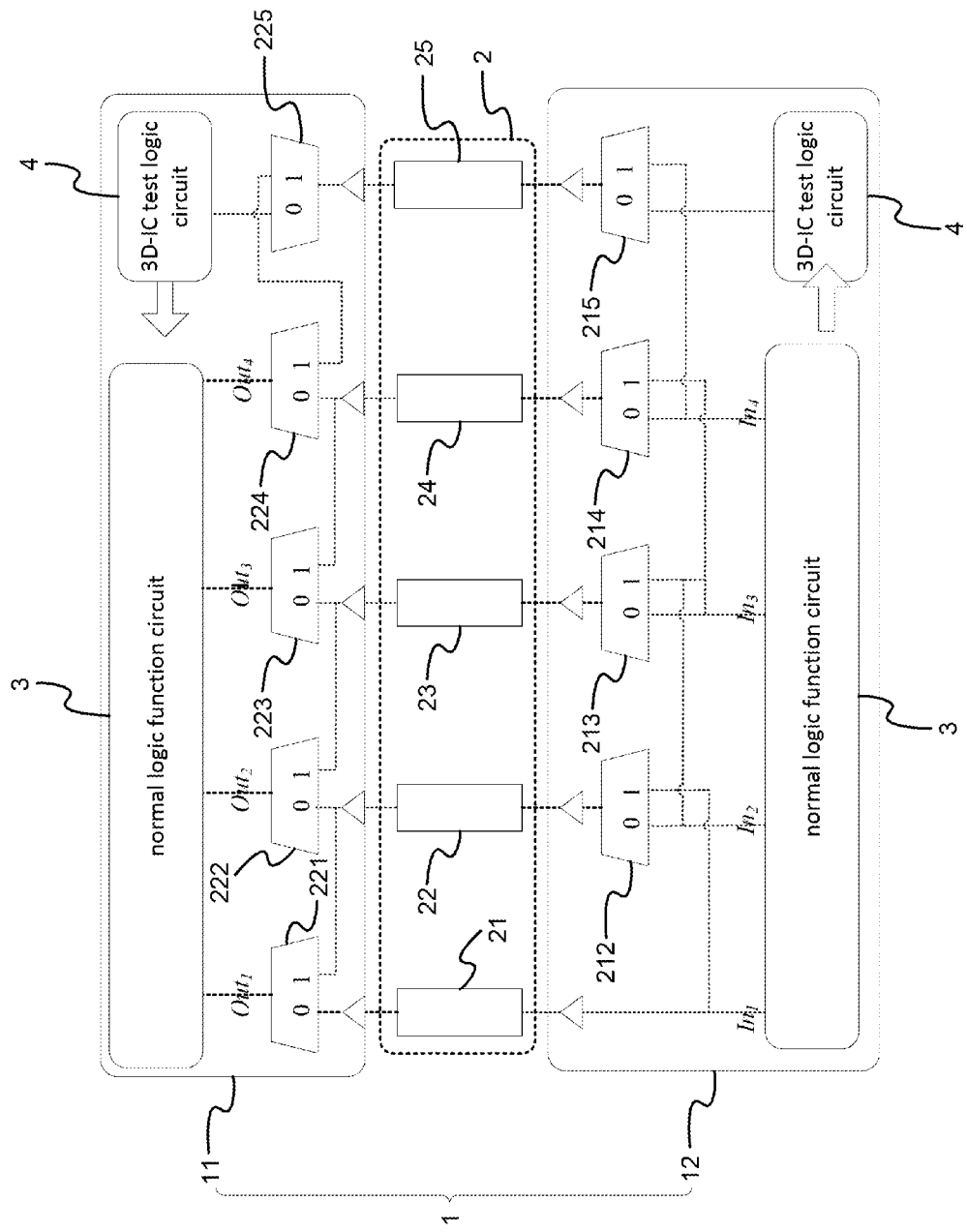
FIG. 1 is the structural view showing the preferred embodiment according to the present invention.

Please refer to FIG. 1 to FIG. 6, which are a structural view showing a preferred embodiment according to the present invention; views showing states of use under a scan mode and a normal mode; a view showing a state of use when a through-silicon-via (TSV) fails; and views showing an area size and a wire length for a test TSV used as a redundant TSV. As shown in the figures, the present invention is an apparatus of three-dimensional integrated-circuit (3D-IC) chip using a fault-tolerant test TSV, where a test TSV for a 3D-IC test structure is used as a redundant TSV for repairing signals of a 3D-IC chip. The present invention comprises a 3D-IC chip 1, a TSV part 2, two normal logic function circuits 3 and two 3D-IC test logic circuits 4.

The 3D-IC chip 1 comprises a first sub-chip 11 and a second sub-chip 12, where the second sub-chip 12 is stacked on the first sub-chip 11.

The TSV part 2 is set between the first sub-chip 11 and the second sub-chip 12 to transfer signals between the first sub-chip 11 and the second sub-chip 12. The TSV part 2 comprises a plurality of TSVs 21~24 and a test TSV 25. Each of a second to a fourth TSVs 22~24 is set with a first multiplexer 212~214 at an input terminal. The first multiplexer 212~214 is coupled to the input terminals of the second to the fourth TSVs 22~24 through a shared terminal. Each of a first to the fourth TSVs 21~24 is set with a second multiplexer 221~224 at an output terminal. The second multiplexer 221~224 is coupled to the output terminals of the first to the fourth TSVs 21~24 through a selecting terminal. The test TSV 25 has a third multiplexer 215 at an input terminal and a demultiplexer 225 at an output terminal. The third multiplexer 215 is coupled to the input terminal of the test TSV 25 through the shared terminal. The demultiplexer 225 is coupled to the output terminal of the test TSV 25 through the shared terminal. The test TSV 25 is used as a redundant TSV to repair signal of one of the first to the fourth TSVs 21~24 when the one of the first to the fourth TSVs 21~24 fails.

The normal logic function circuits 3 are set in the first and the second sub-chips 11,12 and are connected to the first to the fourth TSVs 21~24, the first multiplexers 212~214 and the second multiplexers 221~224, where signals are transferred through the first to the fourth TSVs 21~24.

The 3D-IC test logic circuits 4 are set in the first and the second sub-chips 11,12 and are connected to the test TSV 25 with the third multiplexer 215 and the demultiplexer 225 for transferring test data between the first and the second sub-chips 11,12 and outputting test results through the test TSV 25. Thus, a novel apparatus of 3D-IC chip using a fault-tolerant test TSV is obtained.

Figure 2:
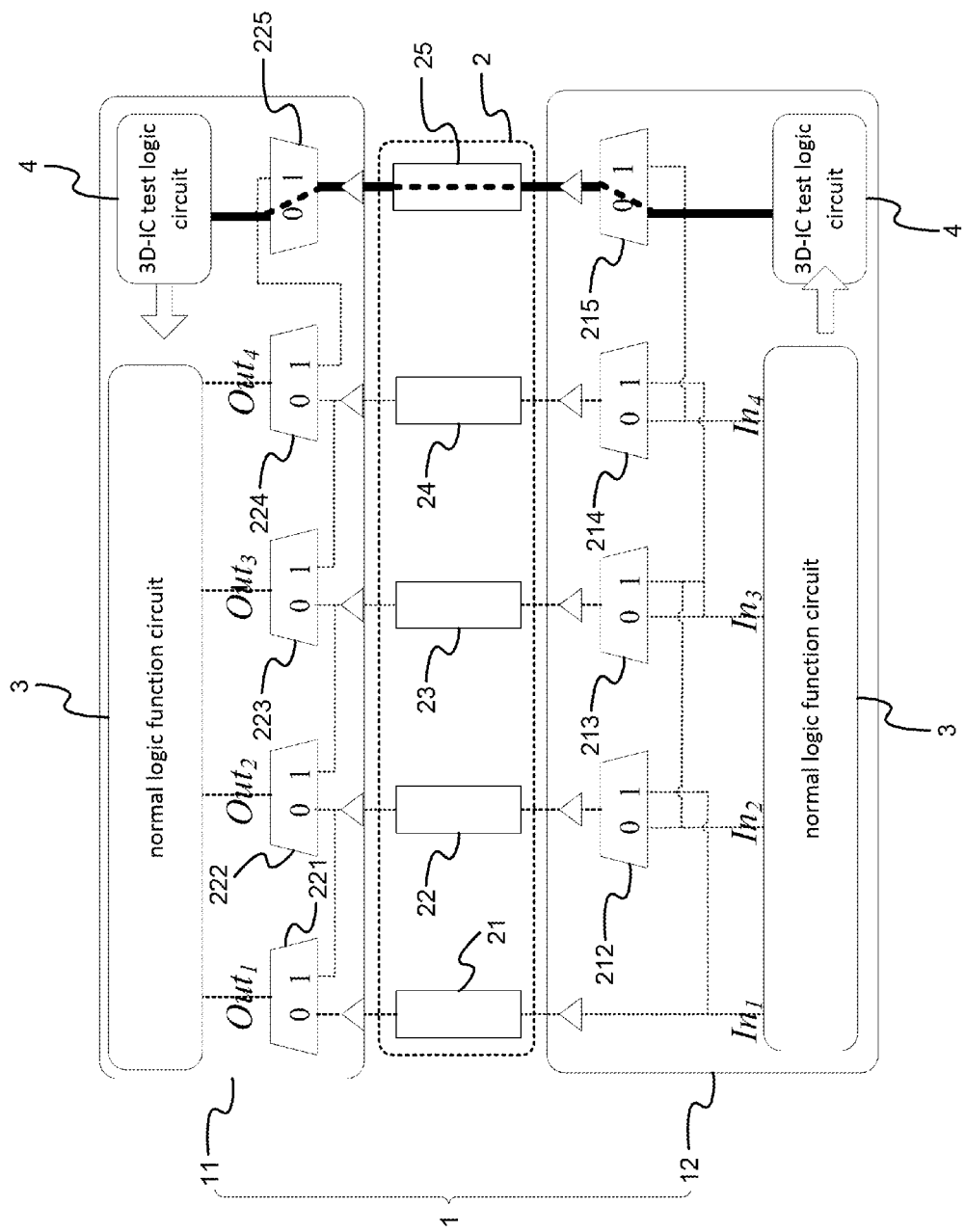
FIG. 2 is the view showing the state of use under the scan mode.
Figure 3:
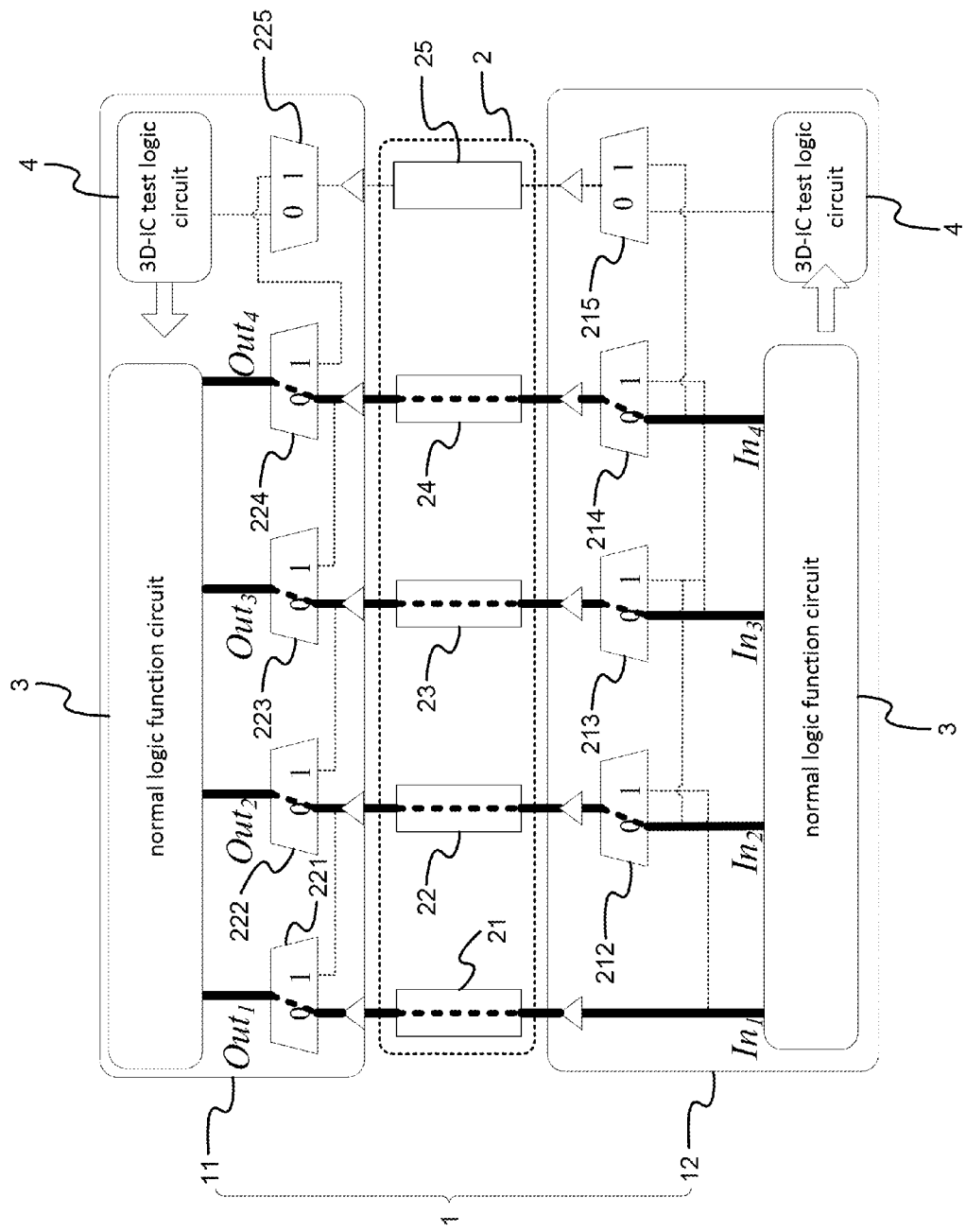
FIG. 3 is the view showing the state of use under the normal mode.
Figure 4:
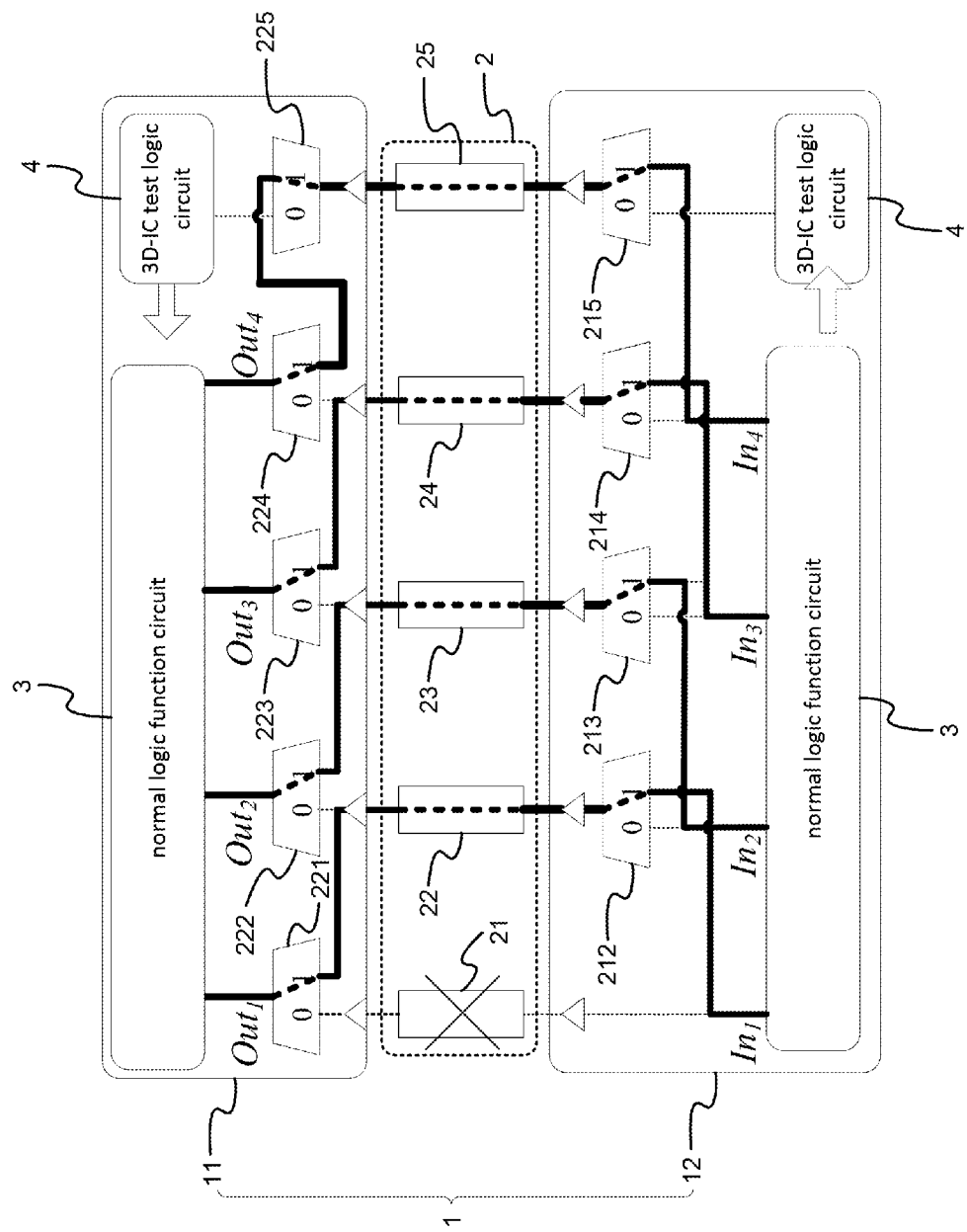
FIG. 4 is the view showing the state of use when the TSV fails.

In FIG. 2, on using the present invention, the test TVS 25 provides circuit test for the 3D-IC chip 1 under a scan mode by adjusting selecting signals of the third multiplexer 215 and the demultiplexer 225 to 0; transferring test data between the first sub-chip 11 and the second sub-chip 12; and outputting test result. In FIG. 3, when none of the TSVs fails, the selecting signals of the first multiplexers 212~214 and the second multiplexers 221~224 are adjusted to 0 with the third multiplexer 215 and the demultiplexer 225 un-activated. Thus, all the signals between the first and the second sub-chips 11,12 are normally transferred along the original paths of the TSVs 21~24. In FIG. 4, when one of the TSVs fails, such as the first TSV 21, the selecting signals of the first multiplexers 212~214, the second multiplexers 221~224, the third multiplexer 215 and the demultiplexer 225 are adjusted to 1 so that all the signals between the first and the second sub-chips 11,12 are shifted to neighboring TSVs, where the signal of the failed first TSV 21 is shifted to the second TSV 22. The test TSV 25 is used as a redundant TSV for shifting the signal of the neighboring TSV. In another word, the signal of the fourth TSV 24 is transferred through the redundant TSV so that all signals are normally transferred as are repaired.

In FIG. 5, the present invention uses different test bandwidth (32-bits, 48-bits and 64-bits); and, by using the test TSV in a two-layer structure and a four-layer structure, 3.4% and 4.1% of the chip area can be reduced, respectively, due to no extra area occupied by redundant TSVs. Traditionally, in order to achieve a certain yield of TSV, redundant TSVs are used so that the test TSV is placed at a worse position in the test wiring design; but, in FIG. 6, the present invention achieves an average reduction of 21.8% of the total length of the test wiring by using the test TSV.

The present invention uses a test TSV, which will transfer test data for a 3D-IC chip when being operated under a scan mode, to repair another failed TSV when being operated under a normal mode. Since the test TSV does not transfer signal under the normal mode, the present invention provides a structure for repairing the failed TSV without increasing the chip area. The test TSV is functioned as a redundant TSV for repairing signal. Through replacing the failed TSV with the test TSV used for testing the 3D-IC chip, the chip area is not increased and the yield is improved as well. Besides, the number of redundant TSVs used is apparently reduced with lowered production cost.

To sum up, the present invention is an apparatus of 3D-IC chip using a fault-tolerant test TSV, where a failed TSV is repaired without increasing chip area; a test TSV is functioned as a redundant TSV for repairing signal; through replacing the failed TSV with the test TSV, the chip area is not increased and yield is improved as well; and the number of redundant TSVs used is apparently reduced with lowered production cost.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An apparatus of three-dimensional integrated-circuit (3D-IC) chip using a fault-tolerant test through-silicon-via (TSV), comprising
    a 3D-IC chip, said 3D-IC chip comprising a first sub-chip and a second sub-chip, said second sub-chip being located on said first sub-chip;
    a TSV part, said TSV part being located between said first sub-chip and said second sub-chip, said TSV part comprising a plurality of TSVs and a test TSV, each of said TSVs having a first multiplexer at an input terminal and a second multiplexer at an output terminal, said test TSV having a third multiplexer at an input terminal and a demultiplexer at an output terminal,
        wherein said TSV part transfers signals between said first sub-chip and said second sub-chip; and said test TSV is used as a redundant TSV to repair signal of one of said TSVs when said one of said TSVs fails;
    two normal logic function circuits, said normal logic function circuits being located in said first and second sub-chips, said normal logic function circuits being connected with said TSVs, said first multiplexers and said second multiplexers,
        wherein said normal logic function circuits transmit signals through said TSVs; and
    two 3D-IC test logic circuits, said 3D-IC test logic circuits being located in said first and second sub-chips, said 3D-IC test logic circuits being connected with said test TSV, said third multiplexer and said demultiplexer,
        wherein said 3D-IC test logic circuits transfer test data between said first sub-chip and said second sub-chip through said test TSV and output test result.

2. The apparatus according to claim 1,
wherein said test TVS provides said 3D-IC chip to adjust selecting signals of said third multiplexer and said demultiplexer to 0 under a scan mode to transfer test data between said first sub-chip and said second sub-chip and to output test result.

3. The apparatus according to claim 1,
Wherein, when none of said TSVs fails, selecting signals of said first multiplexers and said second multiplexers are adjusted to 0 to transfer all signals between said first sub-chip and said second sub-chip through original paths of said TSVs.

4. The apparatus according to claim 1,
wherein, when one of said TSVs fails, selecting signals of said first multiplexers, said second multiplexers, said third multiplexer and said demultiplexer are adjusted to 1 to shift all signals of said first multiplexers, said second multiplexers, said third multiplexer and said demultiplexer to neighboring TSVs; said signal of said failed one of said TSVs is also shifted to another one of said TSVs; said test TSV is used as a redundant TSV to which said signal of a neighboring one of said TSVs is shifted; and, thus, all signals are successfully transferred.

5. The apparatus according to claim 1,
wherein a shared terminal of each of said first multiplexers is coupled to said input terminal of each of said TSVs.

6. The apparatus according to claim 1,
wherein a shared terminal of said third multiplexer is coupled to said input terminal of said test TSV.

7. The apparatus according to claim 1,
wherein a shared terminal of said demultiplexer is coupled to said output terminal of said test TSV.

8. The apparatus according to claim 1,
wherein a shared terminal of each of said second multiplexers is coupled to said output terminal of each of said TSVs.

* * * * *